United States Patent [19]

Kiyooka

[11] 4,352,107
[45] Sep. 28, 1982

[54] MATCHING CABLE FOR AUTOMOBILE ANTENNAS FOR RECEIVING FM BROADCASTS

[75] Inventor: Hisamaro Kiyooka, Kawasaki, Japan

[73] Assignee: Harada Industry Co., Ltd., Tokyo, Japan

[21] Appl. No.: 228,982

[22] Filed: Jan. 27, 1981

[30] Foreign Application Priority Data

Aug. 22, 1980 [JP] Japan .................. 55-115382

[51] Int. Cl.³ .............................................. H01Q 1/32
[52] U.S. Cl. ....................................... 343/715; 343/860
[58] Field of Search ............... 343/712, 715, 860, 861, 343/862, 900, 901

[56] References Cited

U.S. PATENT DOCUMENTS 2,911,643 11/1959 Gergely ............................. 343/711
4,228,544 10/1980 Guyton ............................. 343/860
4,268,805 5/1981 Tanner et al. ..................... 343/711

Primary Examiner—Eli Lieberman
Attorney, Agent, or Firm—Frishauf, Holtz, Goodman & Woodward

[57] ABSTRACT

A matching cable of the invention comprises a coaxial cable which is detachably connected at its one end to a first end of an antenna cable a second end of which is connected to an automobile antenna element, and which is detachably connected at its other end to an AM/FM receiver; and a capacitor connected to the central conductor and the outer conductor of the coaxial cable at the other end. The length of the coaxial cable is so determined that the resistance components of the impedance as viewed from the other end of the coaxial cable are substantially equal to the input impedance of the receiver and the reactance components are inductive at substantially the central frequency of the region of the receiving FM bands for which the improvement of the VSWR is desired. The electrostatic capacitance of the capacitor is such that the inductive reactance may be substantially cancelled.

2 Claims, 8 Drawing Figures

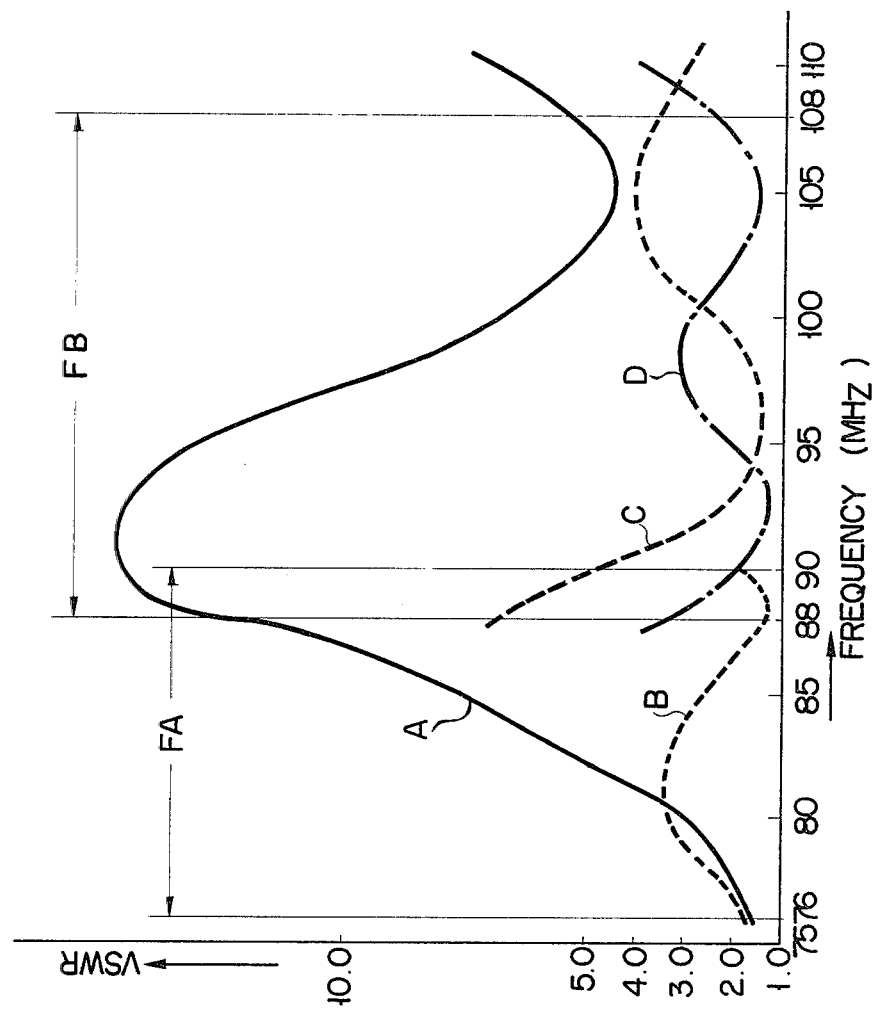

MATCHING CABLE FOR AUTOMOBILE ANTENNAS FOR RECEIVING FM BROADCASTS

BACKGROUND OF THE INVENTION

The present invention relates to a matching cable which couples, with excellent matching, an automobile antenna for FM broadcasts and a receiver capable of receiving FM broadcasts.

Automobile antennas have been conventionally used widely and generally have an antenna element which is rod-shaped and telescoping, and a coaxial cable (to be referred to as a cable for brevity hereinafter), one end of which is connected to the feeding point of the antenna element and the other end of which is connected to the receiver. The antenna element is generally 1.0 to 1.2 m in length and is designed to have an electrostatic capacity (to be referred to as a capacity for brevity hereinafter) which, when the antenna element side is viewed from the other end of the cable during the reception of a medium frequency wave, is the capacity the receiver requires for the same medium frequency wave, for example, 80 pF.

Conventional automobile antennas are suitable for reception of amplitude-modulated medium frequency waves (to be referred to as AM waves for brevity hereinafter) and are not specifically designed in terms of impedance matching for receiving frequency-modulated VHF waves (to be referred to as FM waves for brevity hereinafter). For receiving the FM broadcasts, depending on the receiving band and the length of the antenna element, the voltage standing wave ratio (to be referred to as VSWR hereinafter) for 75 ohms measured at the other end of the cable is great, and it tends to become mismatched with the FM receiver. Such a condition is shown in FIG. 1. FIG. 1 is a graph showing the relation of the FM wave frequency and the VSWR of an automobile antenna consisting of an antenna element of 1.0 m length and a cable of 1.2 m length attached thereto, wherein the FM wave frequency is plotted along the abscissa and the VSWR (at 75 ohms) is plotted along the ordinate. As shown in FIG. 1, with this antenna, the VSWR is small in the FM broadcasting band (76 to 90 MHz) allowed to use in the region shown by FA of the figure, for example, in Japan, so that broadcasts in the FA region may be received well. However, for receiving the FM broadcasting band (88 to 108 MHz) allowed in the region shown by FB, for example, in the U.S.A. and European countries, the VSWR becomes greater so that problems arise such as energy losses due to mismatching of the antenna with the receiver, degradation in the receiving sensitivity, generation of distortion in the FM broadcasts and so on. Although the VSWR characteristic for an antenna element of 1.0 m is shown in FIG. 1, the VSWR characteristic becomes greater and can even reach 15 when the antenna element is longer. Attempts are recently being made in the U.S.A. to shorten the length of the antenna element to make it close to a quarter wavelength of the FM broadcasting band. However, it is well known that better sensitivity may be obtained with a longer antenna length when matched for FM broadcasting.

SUMMARY OF THE INVENTION

The primary object of the present invention, therefore, is to provide a matching cable which is capable of, when any of the automobile antenna elements of various lengths is mounted to an automobile and an FM broadcast in any FM broadcasting band is received, receiving any desired FM broadcast with excellent matching while maintaining the receiving ability of the AM broadcast reception.

In order to achieve the above objects, the present invention provides a matching cable which includes a coaxial cable, a first connector and a second connector mounted to the one end and the other end of the coaxial cable respectively. One end of an antenna cable of a certain length comprising a coaxial cable is connected to the feeding point of the rod-shaped antenna element belonging to the automobile antenna installed in the automobile, and its other end is detachably connected to the first connector. The second connector connected to the other end of the matching cable is detachably connected to a receiver which is installed in the automobile and which is capable of receiving an FM broadcast. Inside the second connector is housed a capacitor connected to the central conductor and the outer conductor of the coaxial cable. The length of the matching cable is so selected that the resistance components of the impedance of the antenna element side when viewed from the second connector are substantially equal to the impedance of the receiver, and the reactance components are inductive (to be referred to as the first condition). The capacitance of the above-mentioned capacitor is so selected as to generate the capacitance reactance which cancels the inductive reactance (to be referred to as the second condition). The length of the matching cable and the capacitance of the capacitor are calculated for the substantially central frequency i.e. specified frequency of the region of the receiving FM broadcasting band in which the VSWR is great, that is, the region in which the matching is not good. When the matching cable determined in the manner as described above is used, the VSWR as measured from the other end of the matching cable may be suppressed to a value which is acceptable for the specified frequency as well as for the entire corresponding FM broadcasting band. The matching method for reducing the VSWR toward 1.0 for one specified frequency will be referred to as single matching.

The above-mentioned matching cable is detachably connected between the antenna cable and the receiver. Accordingly, the matching cables of the present invention may be prepared for various antenna element lengths and FM broadcasting bands. Then, even when any given antenna body (a combination of an antenna element with an antenna cable of a certain length) is installed in advance to an automobile, a matching cable suited to the FM broadcasting band of the region or the country in which the automobile is used may be selected from the prepared matching cables to be connected between the antenna body and the receiver, so that the FM broadcast in this FM broadcasting band may be clearly received. Since the number a of lengths of the antenna element for automobiles and the number b of the FM broadcasting bands are relatively small through the European countries, the U.S.A. and Japan, matching numbers equal to all the combinations (a×b) of these may be prepared so that any of the FM broadcasting bands may be received with good matching, independently of the length of the antenna element used. When the length of the antenna cable which is connected at one end to the antenna element is selected in a suitable manner, and when the other end is extended to a position at which it may be easily and safely detachably connected to one end of the matching cable, a suitable matching cable may be connected between this other end of the antenna cable and the receiver is a short period of time so that any of the FM broadcasting bands may be received under excellent matching conditions.

The matching methods described above are all classified as single matching. Although the predetermined FM band broadcast may be well received thereby, double matching to be described below may be used for reception under much better matching conditions. According to double matching method, the above-mentioned matching cable (to be referred to as the first matching cable for distinction from a second matching cable to be described below) is detachably connected at its other end to one end of a second matching cable of the same type as the first matching cable. The other end of the second matching cable is detachably connected to the receiver. The length of the second matching cable and the capacitance of the capacitor are so determined that the first and second conditions are satisfied for the specified frequency different from that in the case of the first matching cable. When both of the specified frequencies for determining the first and second matching cables are selected to be high and low frequencies for improving the VSWR within the receiving FM broadcasting band, the value of the VSWR of the entire receiving FM broadcasting band may be suppressed to a lower value than in the case of single matching, and the matching of the antenna with the receiver for the entire band may be improved.

Double matching is performed with two matching cables in the above case, however, it may be performed with a single matching cable. In this case, when the predetermined value of the length of the antenna cable, that is, the length of the antenna cable for extending the other end of the antenna cable to one end of the matching cable easily and safely satisfies the first condition described above for one of the specified frequencies, the capacitor satisfying the second condition may be connected inside the first connector to match with the above-mentioned specified frequency, and the length of the matching cable and the capacitance of the capacitor inserted in the second connector may be selected to satisfy the first and second conditions for the other of the two specified frequencies. Although this double matching is not general, but is used when the length of the antenna cable is substantially close to a certain value, it is capable of reducing the manufacturing cost of the antennas since the double matching may be achieved with a single matching cable when the length is close to the predetermined value described above.

The antenna using the matching cable of the present invention is designed to be able to also receive AM broadcasts under good matching conditions. That is, the length of the cable is so determined that the antenna element side reactance when viewed from the other end of the matching cable is inductive, and a capacitor is used for cancelling this. Due to the use of this capacitor, the AM waves received by the antenna element are not greatly affected by the cancelling means to be attenuated during the transmission to the receiver, so that good reception of the AM broadcast is possible. Although the antenna capacitance as viewed from the receiver becomes greater than the antenna capacitance of the single matching method, due to the presence of the capacitor connected inside the connector of the matching cable, this capacitance increase may be compensated by known means. The details of such means are described with reference to the description of the preferred embodiment.

BRIEF DESCRIPTION OF THE DRAWINGS

FIG. 6 is a view illustrating an improved VSWR characteristic using a conventional automobile antenna incorporating an antenna element of 1.2 m length and various matching cables.

DETAILED DESCRIPTION OF THE PREFERRED EMBODIMENTS

Figure 2:
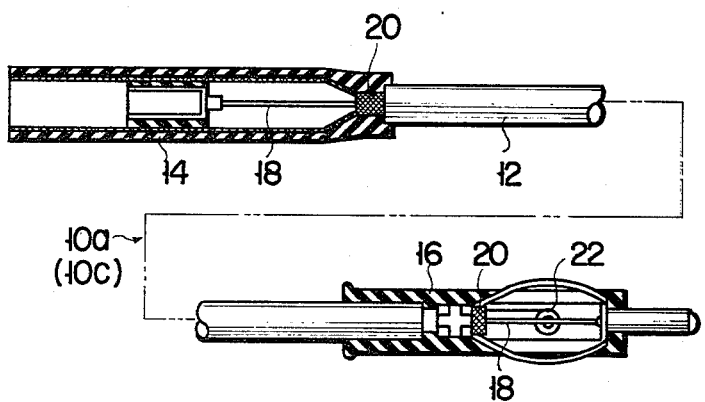
FIG. 2 is a partial sectional view of one embodiment of the matching cable of the present invention.

The matching cable of the present invention will now be described in more detail. FIG. 2 shows a matching cable 10a of the first embodiment. The matching cable 10a has a coaxial cable 12, a connector 14 mounted to one end of the cable 12, a connector 16 mounted to its other end of the cable 12, and a capacitor 22 encased inside the connector 16 and connected to a central conductor 18 and an outer conductor 20 of the coaxial cable 12.

Figure 3:
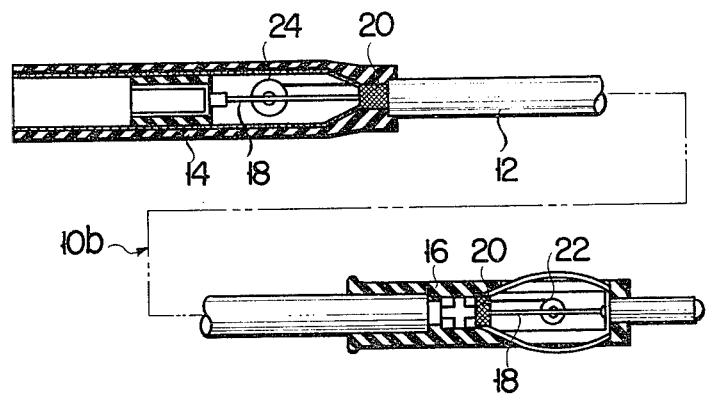
FIG. 3 is a partial sectional view of another embodiment of the matching cable of the present invention.

FIG. 3 shows a matching cable 10b according to the second embodiment. The difference between the cable 10b and the cable 10a resides in the fact that a capacitor 24 is encased within both conductors of the coaxial cable 12 inside the connector 14 in the case of the cable 10b.

Figure 4A:
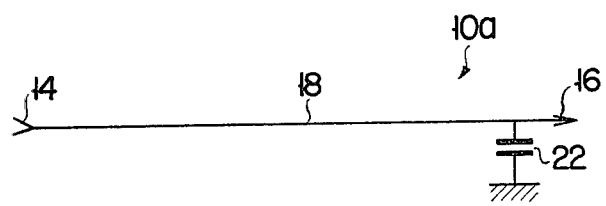
FIG. 4a is a circuit diagram of the matching cable shown in FIG. 2.
Figure 4B:
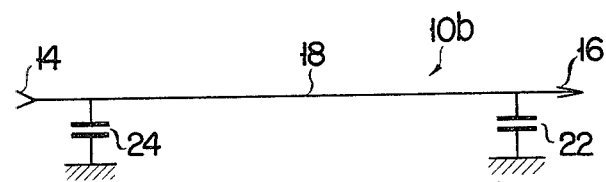
FIG. 4b is a circuit diagram of the matching cable shown in FIG. 3.
Figure 4:
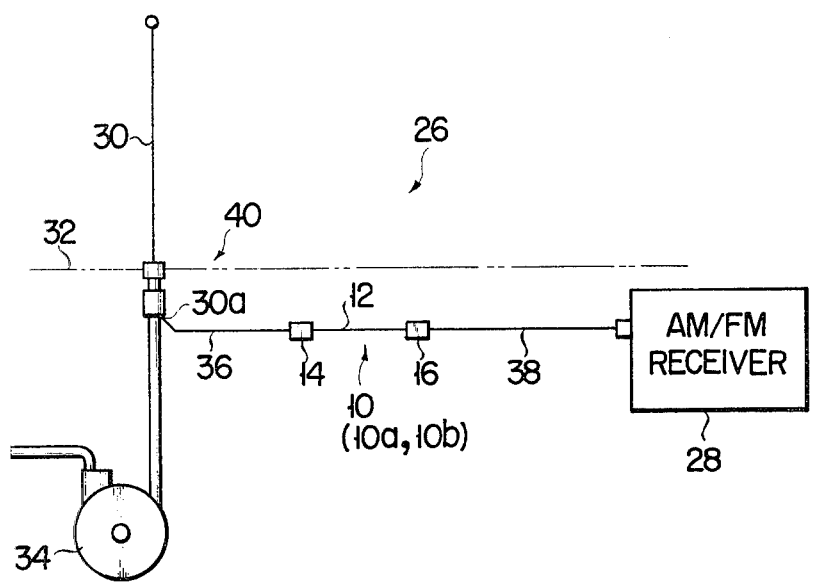
FIG. 4 shows one embodiment of an automobile antenna incorporating one matching cable.

FIG. 4 shows an automobile antenna 26 incorporating the above-mentioned matching cable 10 and an AM/FM receiver 28 (to be referred to as a receiver for brevity hereinafter) connected to the antenna. An antenna element 30 of rod-shape as shown in FIG. 4 is mounted on a fender 32, for example, of an automobile (not shown) and retracts by the action of a motor 34. As the matching cable 10, the matching cable 10a shown in FIG. 2 may be generally used as will be described, but the matching cable 10b may be used when the conditions to be described below are satisfied. One end of an antenna cable 36 comprising a coaxial cable is connected to a feeding point 30a, and its other end or first end is detachably connected to the connector 14 mounted to one end of the matching cable 10. The one end of the antenna cable 36 is named by a second end. The connector 16 mounted to the other end of the matching cable 10 is directly connected to the receiver 28 or detachably connected to one end of a junction cable 38. When the junction cable 38 is used, its other end is connected to the receiver 28. The structure combining the antenna element 30 and the antenna cable 36 is called an antenna body 40, and the structure combining the antenna body 40 and the matching cable 10, and the junction cable 38 as needed. is called an automobile antenna 26 or an antenna 26.

The length of the antenna cable 36 is suitably determined depending on the type of automobiles, and its other end is extended out to a position at which it is detachably connected to one end of the matching cable 10. This is because the feeding point 30a of the antenna element 30 generally is at a part which is relatively inaccessible, so that the matching cable may not otherwise be easily and safely detached.

Next the manner in which the length of the cable 10a and the capacitance of the capacitor 22 are determined when the matching cable 10a of FIG. 2 is used as the matching cable 10 of FIG. 4 will be described. In order to do so, first, the central frequency of the frequency region, that is the specified region, at which the VSWR is great in the receiving FM broadcasting band, the matching of the antenna and the receiver 28 is poor, and improvement must be made. The length of the matching cable 10a is determined according to the first condition according to which the resistance components of the impedance, when the cable is connected to the antenna body 40 and the antenna element 30 side is viewed from the other end of the cable 10a, are substantially equal to the impedance (e.g., 75 ohms) of the receiver 28, and the reactance components are inductive. The capacitance of the capacitor 22 is determined according to the second condition according to which the reactance obtained from this capacitor must be the capacitive reactance that substantially calcels the inductive reactance. Such length of the matching cable and the inductive reactance to be cancelled may be easily obtained according to the Smith Chart based on the impedance when the antenna element side is viewed from the other end of the antenna cable 36, the input impedance of the receiver 28, and the characteristic impedance of the matching cable 10a.

Figure 1:
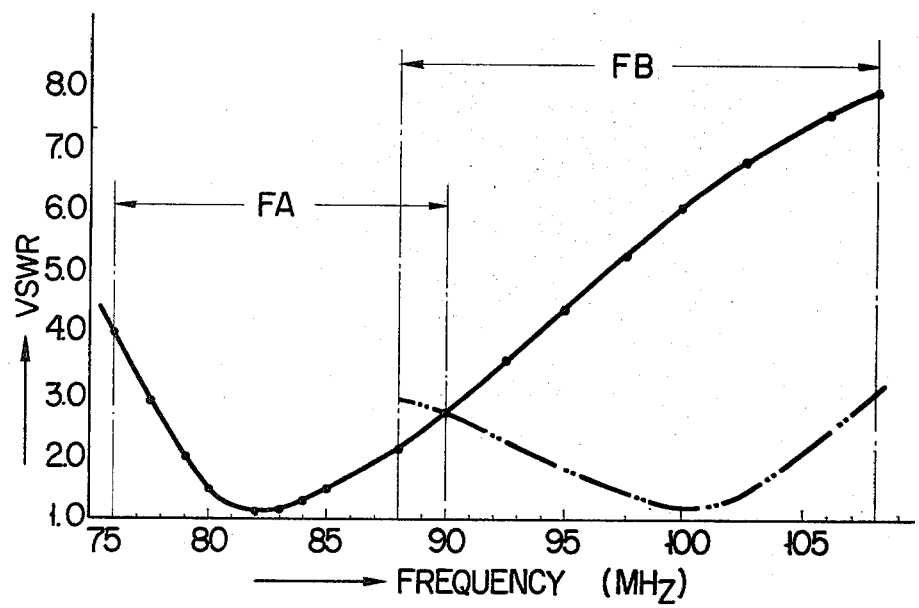
FIG. 1 is a graph illustrating one example of the relation of the FM frequency and the VSWR of an automobile antenna incorporating a conventional antenna element of 1.0 m length.

When the matching cable 10a of FIG. 2 is used as the matching cable 10 of FIG. 4, the VSWR as measured from the other end of the matching cable 10a may be extremely reduced at the above specified frequency since the resistance components of the impedance when the antenna element side is viewed from the other end of the matching cable 10a are substantially equal to the input impedance of the receiver 28, and the reactance is substantially cancelled, and the VSWR may be reduced within the entire receiving FM broadcasting band for enabling excellent reception of FM broadcasts. The curve (FIG. 1) as shown by the alternate long and two short dashed line shows the VSWR characteristic improved by connecting the matching cable 10a in relation to the VSWR characteristic of the FB region of the conventional antenna incorporating an antenna element of 1.0 m length. It is seen from this figure that, before the improvement, the VSWR has a high value of 4 to 8 in the FB region within the range of 94 to 108 MHz, and after the improvement, it is suppressed to less than 3. In this case, the specified frequency was 100 to 101 MHz. According to the experiment conducted, by the present inventors, the length of the matching cable 12 and the capacitance of the capacitor were 300 mm and 18 pF. The method for selecting one specified frequency in the receiving FM broadcasting band and determining the characteristic of the matching cable at this frequency, that is, determining the length of the cable and the capacitance of the capacitor is the single matching mentioned hereinabove.

Figure 5:
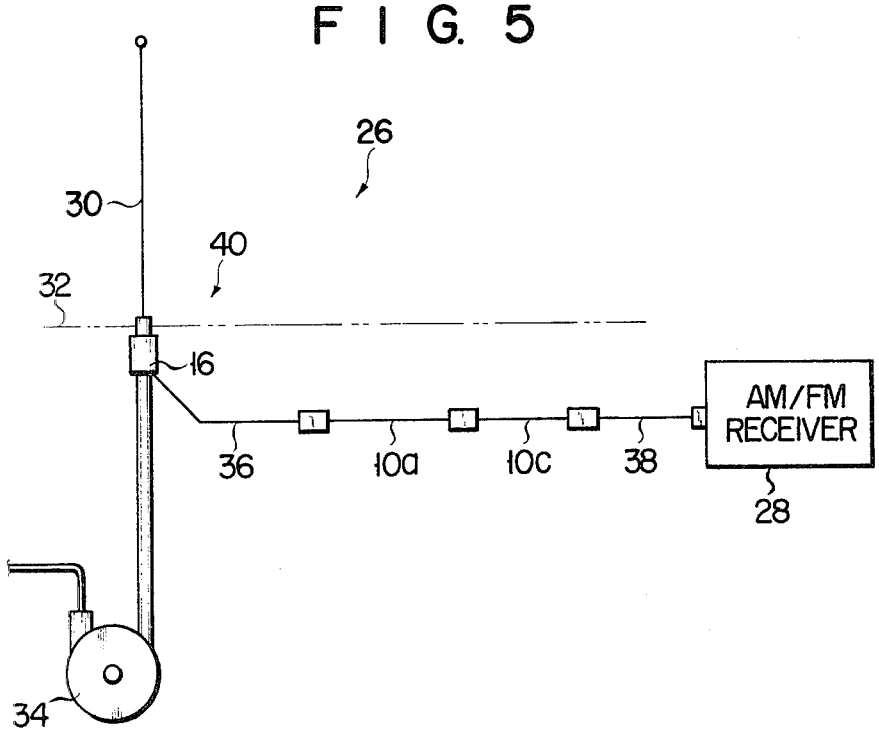
FIG. 5 shows one embodiment of an automobile antenna incorporating two matching cables.

The matching cable 10a of FIG. 2 may not only be used for such single matching but also be used for double matching. When using the double matching two of the matching cables may be connected in series as shown in FIG. 5 and two specified frequencies in the receiving FM broadcasting bands may be determind to improve the VSWR at the two points thereby improving the VSWR of the entire receiving FM broadcasting band more than by single matching. The antenna 26 shown in FIG. 5 is constructed such that the second matching cable 10c of the same type is connected to the other end of the matching cable 10a of the antenna shown in FIG. 4. The two specified frequencies are determined to be the central frequencies of the two regions in which the VSWRs in the receiving FM broadcasting bands must be improved. The matching cable 10a is so formed to satisfy the first and second conditions for, for example, the higher frequency of the specified frequencies. The cable 10c is so formed to satisfy the first and second conditions for the lower frequency of the specified frequency.

The matching cable 10b described with reference to FIG. 3 is used as one kind of the matching cable 10 to be used in the antenna 26 of FIG. 4, so that double matching described above may be applied for coupling the antenna 26 to the receiver 28. Two specified frequencies are selected as in the case of FIG. 5. The double matching described above is used when the length of the antenna cable 36 is substantially equal to the length which satisfies the first condition for one of the specified frequencies. In such a case, the capacitance of the capacitor 24 of the matching cable 10b is so determined to satisfy the second condition. The length of the matching cable 10b and the capacitance of the capacitor connected to its other end are so determined to satisfy the first and second conditions for the other of the specified frequencies. The antenna 26 consisting of the antenna cable 36 and the matching cable 10b is advantageous in that the double matching may be performed with only one matching cable 10b unlike in the case of FIG. 5.

FIG. 4a and FIG. 4b show the circuit diagrams of the matching cables 10a and 10b respectively. For the sake of simplicity, the central conductor 18 is shown by single line, and the outer conductor 20 is indicated as a earth symbol.

FIG. 6 shows the VSWR characteristic A for the frequency of the conventional automobile antenna incorporating one example of the antenna element of 1.1 m length and the VSWR characteristics B, C and D of this antenna improved by the single matching or the double matching according to the present invention. These VSWR characteristics are measured at the end of the cable to be connected to the receiver. As may be seen from the figure, the VSWR is as low as about 1.5 at the low frequency part of the FA region with the conventional antenna, and increases to about 14 as the frequency becomes higher. The VSWR becomes more than 13 at the low frequency part of the FB region. Although the VSWR becoes smaller at frequencies higher than this, it does not become less than 4 even at the minimum. Accordingly, with such a conventional antenna, the VSWR must be decreased for the frequency over about 80 MHz for the FA region, and it must be generally decreased for the FB region.

The curve B shows the VSWR characteristic improved by reducing the VSWR at the high frequency part of the FA region by the single matching using the matching cable 10a of FIG. 2 for the above-mentioned conventional antenna. In this case, the VSWR becomes substantially less than 3.5 for the entire FA region and the FM broadcasts in the FA region may be clearly received.

The curve C shows the VSWR characteristic improved by reducing the VSWR by the single matching using a frequency slightly lower than the central frequency of the FB region as the specified frequency. It is to be noted that the matching cable 10a in this case has a length and a capacitor which are different from those of the matching cable whose characteristics are improved for the FA region. As may be seen from a comparison of the curves C and A, the VSWR is significantly improved; it is less than 4 at a frequency of over 91 MHz but reaches 4 to 7 for a frequency less than 91 MHz.

The curve D shows the VSWR characteristic improved by reducing the VSWR at a relatively high frequency of the FM region and at a relatively low frequency by the double matching using the matching cable 10b of FIG. 3 for the conventional antenna. As may be seen from the curve D, although the VSWR varies depending upon the frequencies in the FB region, its value is almost always reduced to less than 3 so that the FM broadcasts in the entire FB region may be clearly received.

Although two embodiments of the matching cable are shown in FIGS. 2 and 3, they are described only for the purpose of illustration and other modifications are also possible. For example, in the embodiment shown in FIGS. 2 and 3, the connectors mounted to both ends of the matching cable is a jack at the antenna cable side and a plug at the receiver side. However, the present invention is not limited to this particular construction and the jack and the plug may be replaced with each other. Other types of connectors may also be used only if they are capable of detachably connecting the coaxial cables. Although the capacitors shown in FIGS. 2 and 3 are not of variable type, trimmer capacitors of variable type may alternatively be used. The use of such a trimmer capacitor is advantageous in that the cancellation of the reactance with the capacitor may be performed with precision and the types of the capacitors to be prepared for manufacturing the matching cables may be reduced.

With the matching cable of the present invention, an automobile antenna which is capable of clearly receiving any of the FM broadcasting bands may be obtained by combining with this matching cable the antenna body formed by connecting the automobile antenna element of a certain length installed in advance to the automobile and an antenna cable of a certain length. Since the length of the matching cable and the capacitance of the capacitor are mainly determined by the length of the antenna element and the receiving FM broadcasting band since the length of the antenna cable is designed to be substantially constant for the same type of the automobiles. More specifically, the length of the cable and the capacitance of the capacitor are determined to satisfy the first and second conditions described above. When this automobile travels to a region or a country where it receives other FM receiving band, the matching cable suitable for such a band is replaced with the current matching cable. The adoption of the matching system for the antenna body and the receiver using the matching cable of the present invention is advantageous also for the automobile manufacturers. This is bcause, even if the suitable antenna body is mounted to the automobile in advance, when a customer desires to receive some other FM broadcasting band, the request of the customer may be realized by connecting the matching cable suitable for reception of this band between the antenna body and the receiver. This connection furthermore is extremely easy since the other end of the antenna cable is extended to a place where the connection may be easily and safely performed. The number of the types of the matching cable 10a of FIG. 2 to be prepared at the automobile manufacturers or the service stations where the matching cables may have to be replaced is 6 kinds when the single matching is adopted which is equal to the product of three main kinds of the length of the antenna element, for example, and the two frequency bands, FA and FB regions shown in FIGS. 1 and 6. Six further matching cables 10c may only have to be prepared when the double matching is adopted.

The antenna incorporating these matching cables is designed to be capable of receiving the AM broadcasts well. Thus, as the antenna, the automobile antenna of about 1.0 to 1.2 m length which has a capacity corresponding to those which are widely used for reception of the AM broadcasts is used, and the reactance components of the impedance of the antenna element side as viewed from the other end of the matching cable are inductive to satisfy the first condition. For cancelling the inductive reactance, a capacitor is incorporated so that the AM broadcast waves may not be short-circuited during the transmission to the receiver and may not be attenuated before reaching the receiver. Since one or two capacitors are attached to the matching cable, the capacitance of the antenna element side as viewed from the cable, the capacitance of the antenna element side as viewed from the receiver becomes greater by about 30 to 100 pF than the input capacitance of the receiver (generally 80 pF). If the matching for the AM broadcast between the receiver and the antenna is broken due to such capacitance increase, a suitable capacitor may be connected in series with the other end of the matching cable for compensating the capacitance increase.

What is claimed is:

1. A matching cable for automobile antennas for receiving FM broadcasts comprising:

a first connector detachably connected to a first end of an antenna cable which comprises a coaxial cable and a second end of which is connected to an antenna element for automobiles functioning in cooperation with a receiver capable of receiving FM broadcasts;

a coaxial cable to one end of which is connected said first connector and having a length such the resistance components of the impedance of said antenna element side as viewed from the other end of said cable are substantially equal to the input impedance of said receiver, and the reactance components are inductive at substantially the central frequency of a frequency region in which the decrease in the VSWR as measured from said other end is desired, that is, at a specified frequency;

a second connector mounted to the other end of said coaxial cable and detachably connected to said receiver; and a capacitor encased inside said second connector, connected in parallel to both conductors of said coaxial cable, and having a capacitance such that the capacitive reactance at said specified frequency substantially cancels said inductive reactance.

2. A matching cable according to claim 1, wherein another capacitor is further connected in parallel to said conductors of said coaxial cable and inside said first connector, said capacitor having a capacitance such that the impedance of said antenna element side as viewed from said first connector has resistance components substantially the same as the input impedance of said receiver at a second specified frequency different from said specified frequency, and such that the capacitive reactance obtained from said capacitor substantially cancels said inductive reactance, thereby reducing the VSWR at both said specified frequencies and in the vicinity thereof.

* * * * *